(12) United States Patent
Shi et al.

(10) Patent No.: US 12,095,172 B2
(45) Date of Patent: Sep. 17, 2024

(54) MULTI-WIDEBAND COLLINEAR DIPOLE ANTENNA

(71) Applicant: Norsat International Inc., Richmond (CA)

(72) Inventors: Xiufeng Shi, Ottawa (CA); Yazi Cao, Newmarket (CA); Tong Li, Aurora (CA)

(73) Assignee: Norsat International Inc., Richmond (CA)

( * ) Notice: Subject to any disclaimer, the term of this patent is extended or adjusted under 35 U.S.C. 154(b) by 120 days.

(21) Appl. No.: 18/091,266

(22) Filed: Dec. 29, 2022

(65) Prior Publication Data

US 2024/0222864 A1   Jul. 4, 2024

(51) Int. Cl.
*H01Q 5/15*   (2015.01)
*H01Q 1/42*   (2006.01)
*H01Q 5/30*   (2015.01)
*H03H 7/38*   (2006.01)

(52) U.S. Cl.
CPC ............... *H01Q 5/15* (2015.01); *H01Q 1/42* (2013.01); *H01Q 5/30* (2015.01); *H03H 7/38* (2013.01)

(58) Field of Classification Search
CPC .. H01Q 5/15; H01Q 5/30; H01Q 1/42; H03H 7/38
See application file for complete search history.

(56) References Cited

U.S. PATENT DOCUMENTS

| | | | |
|---|---|---|---|
| 6,011,524 A * | 1/2000 | Jervis | H01Q 11/08 |
| | | | 343/859 |
| 2010/0302116 A1 | 12/2010 | Patrick et al. | |
| 2017/0264019 A1 | 9/2017 | Mu | |
| 2020/0227821 A1 * | 7/2020 | Wu | H01Q 1/38 |

* cited by examiner

*Primary Examiner* — Monica C King
(74) *Attorney, Agent, or Firm* — Nexus Law Group LLP; Nicholas P. Toth

(57) ABSTRACT

An antenna comprising the primary and secondary radiation structures and impedance-matching circuit are disposed in a collinear configuration with single port. The impedance-matching circuit can expand the antenna bandwidth in plural frequency bands with low VSWR. The transmission line between the RF connector and radiation structures are frictional wrapped by ferrite toroid cores, which improves the antenna in term of electrical stability. This also decreases the antenna sensitivity to the ground plane.

20 Claims, 2 Drawing Sheets

MULTI-WIDEBAND COLLINEAR DIPOLE ANTENNA

BACKGROUND OF THE INVENTION

1. Field of Invention

This invention mainly relates to the transmitting and receiving of electromagnetic radiation, and particularly to a collinear dipole antenna with multiple wide bands.

2. Description of Related Art

U.S. Pat. No. 264,019 A1 to Mu discloses a multiband collinear antenna on a flexible dielectric substrate. The configuration is on the flexible substrate so that the substrate can be bent and inserted into a radome. However, there are limited choices of flexible dielectric substrates. Due to the two-dipole structure, the antenna of Wei only has two working frequency bands.

Another U.S. Pat. No. 302,116 A1 there to Patrick et. al. discloses a vertical dipole antenna covering VHF and UHF from 30 MHz to 512 MHz with a VSWR less than 3:1. It disposes two whip antennas in a collinear configuration. A filter is used to combine/split a signal into the two whip antennas that work at corresponding frequencies. The attenuator provides good matching over VHF and UHF. But the attenuator compromises the antenna efficiency.

The invention mitigates the above shortcomings and provides superior performance comparable to a single-band antenna.

SUMMARY OF THE INVENTION

In accordance with one aspect of the invention, there is provided an antenna having a connector. The antenna includes: (a) a dipole having a first conducting tube and a second conducting tube disposed collinear to the first conducting tube, the first and second conducting tubes being attached to a dielectric substrate extending between the first and second conducting tubes, the dipole being operable to radiate electromagnetic energy in a first frequency bandwidth; (b) a secondary radiation structure disposed on the dielectric substrate, the secondary radiation structure being operable to radiate electromagnetic energy in a second frequency bandwidth higher than the first frequency bandwidth; and (c) an impedance-matching circuit disposed on the dielectric substrate in electrical communication with the connector, the impedance-matching circuit being operable to facilitate radiation in the first frequency bandwidth via fundamental operation of the dipole, the impedance-matching circuit being further operable to facilitate radiation in the second frequency bandwidth via fundamental operation of the secondary radiation structure and via harmonic operation of the dipole.

The secondary radiation structure may be operable to radiate electromagnetic energy in a third frequency bandwidth higher than the first and second frequency bandwidths. The impedance-matching circuit may be operable to facilitate radiation in the third frequency bandwidth via fundamental operation of the secondary radiation structure and via higher-harmonic operation of the dipole. At least one of the impedance-matching circuit and the secondary radiation structure includes a capacitor and a stub disposed on a first side of the dielectric substrate. The impedance-matching circuit may include a balun disposed on a second side of the dielectric substrate opposite the first side. The antenna may be ground-free. The antenna may include a connecting dielectric substrate that extends within the first conducting tube between the connector and the dielectric substrate. The connecting dielectric substrate may be integrally coupled to the dielectric substrate. The antenna may include a transmission line extending within the first conducting tube between the connector and the impedance-matching circuit. The transmission line may be a coaxial cable. The antenna may further include a ferrite toroid circumscribing the coaxial cable. The coaxial cable may include an outer conductor and a center conductor extending within the outer conductor, the outer conductor being in electrical communication with the first conducting tube, the center conductor being in electrical communication with a feeding trace extending along the dielectric substrate, the feeding trace being electromagnetically coupled with the second conducting tube. The center conductor may be in electrical communication with the feeding trace via a balun disposed on the dielectric substrate. The antenna may further include a base pipe extending between the connector and the first conducting tube. The dielectric subtrate may extend from the connector to the second conducting tube. The dielectric substrate may extend within the base pipe and within the first conducting tube. The antenna may further include a radome enclosing the secondary radiation structure and enclosing the first and second conducting tubes. The radome may be collinear to the base pipe. The secondary radiation structure may be operable to radiate electromagnetic energy in a third frequency bandwidth higher than the first and second frequency bandwidths. The impedance-matching circuit may include a balun. The antenna may include a transmission line extending within the first conducting tube between the connector and the balun. The first frequency bandwidth may be the frequency range of 136 MHz to 174 MHz. The second frequency bandwidth may be the frequency range of 380 MHz to 520 MHz. The third frequency bandwidth may be the frequency range of 698 MHz to 960 MHz. The antenna may be operable to transmit and receive electromagnetic energy in the first, second, and third frequency bandwidths. The impedance-matching circuit may be operable to facilitate transmission and reception of electromagnetic energy in the third frequency bandwidth via fundamental operation of the secondary radiation structure and via higher-harmonic operation of the dipole.

In accordance with another aspect of the invention, there is provided an antenna having a connector. The antenna includes: (a) first means for radiating electromagnetic energy in a first frequency bandwidth via fundamental dipole operation; (b) second means for radiating electromagnetic energy in a second frequency bandwidth via secondary dielectric-mounted operation and harmonic dipole operation, the second frequency bandwidth being higher than the first frequency bandwidth; and (c) means for impedance matching a connectorized input to the first means and to the second means.

The antenna may further include third means for radiating electromagnetic energy in a third frequency bandwidth via tertiary dielectric-mounted operation and via higher-harmonic dipole operation, the third frequency bandwidth being higher than the second frequency bandwidth.

In accordance with another aspect of the invention, there is presented a novel antenna concept with the capability to transmit or receive electromagnetic radiation in a plural frequency band to address the above shortcomings with the help of a wideband impedance-matching technique. For each frequency band, the embodiment of the present invention achieves a low VSWR in a wide bandwidth, and they don't require a proper ground plane to maintain these good characteristics with the help of a novel matching circuit.

It is an object of this invention to present a collinear dipole antenna covering VHF, UHF, and 700/800 MHz with one single port. A low VSWR is achieved in all the frequency bands simultaneously.

A further object of this invention is to achieve a rugged and compact design. Even in a harsh environment, the embodiment of the presented invention provides reliable performance.

In accordance with another aspect of the invention, there is provided an antenna that includes: (a) a coaxial cable transmission line feeding at the middle of the antenna; (b) several ferrite toroid cores wrapping the transmission line disposed on the first trace-free dielectric; (c) primary radiation structures made by conducting tubes, the tubes linked by the second dielectric; (d) secondary radiation structures disposed on the first and second layers of the second dielectric; (e) an impedance-matching circuit comprised of a balun, capacitors and tuning stubs disposed on the second dielectric; and (f) a dielectric radome encolouring and providing protection to the antenna structure.

The ferrite toroid cores disposed on the first dielectric wrapping of the feeding coaxial cable can restrict unexpected current going back through the coaxial transmission line and provides the antenna with a more stable electrical performance.

In accordance with another aspect of the invention, there is provided an antenna that includes at least two conducting tubes with a length approximating a half-wavelength at the lowest frequency in the first frequency band. These two conducting tubes are the primary radiation structures that can transmit/receive electromagnetic radiation at the first frequency band. The primary radiation structures are electrically connected to the coaxial cable through a feeding point disposed at the middle of the antenna.

The secondary radiation structures may be disposed on the first and second layers of the second dielectric. The configuration of the first and second layers contributes to at least two frequency bands. The conducting traces disposed on the first and second layers on the second dielectric combined with capacitive components and balun extend the bandwidth over a plural frequency band.

The antenna within a dielectric radome makes the invention survive in a harsh application environment. The base pipe at the bottom of the radome eases the installation of the invented antenna.

In accordance with another aspect of the invention, there is provided an antenna with a low VSWR in a plural frequency band fed by single RF input. The antenna includes: (a) at least the primary and secondary radiation structures disposed in a collinear configuration and enveloped by a non-conducting radome; (b) the primary radiation structures are comprised of at least two conducting tubes and transmit/receive electromagnetic radiation at least at the first frequency band with a low VSWR; and (c) the secondary radiation structures disposed on the first and second layer of the second dielectric to transmit and receive electromagnetic radiation at least at the second and third frequency bands with a low VSWR.

The harmonic electromagnetic radiation frequencies of the primary radiation structures may also contribute to transmitting and receiving electromagnetic radiation at least at the second and third frequency bands. The antenna may further include a dielectric to separate the radiation structures from the RF connector and to make it less sensitive to the ground compared with that without the dielectric. The antenna may include ferrite toroids for frictional wrapping of the RF transmission line to limit the unwanted current going to the RF connector and increase the antenna stability. The antenna may further include a wide bandwidth impedance-matching circuit disposed between the primary and secondary radiation structures to further expand plural frequency with low VSWR simultaneously. The matching circuit may include lumped components, stubs, and a balun. The wide bandwidth impedance-matching circuit may be disposed on the first and second layer on the second dielectric combining with lumped elements such as capacitors, and stubs to achieve wide bandwidth in a plural frequency band.

BRIEF DESCRIPTION OF THE DRAWINGS

An antenna embodiment of the present invention is briefly described with reference to the corresponding drawings where some features are indicated, and wherein.

DETAILED DESCRIPTION OF EMBODIMENTS

Figure 1:
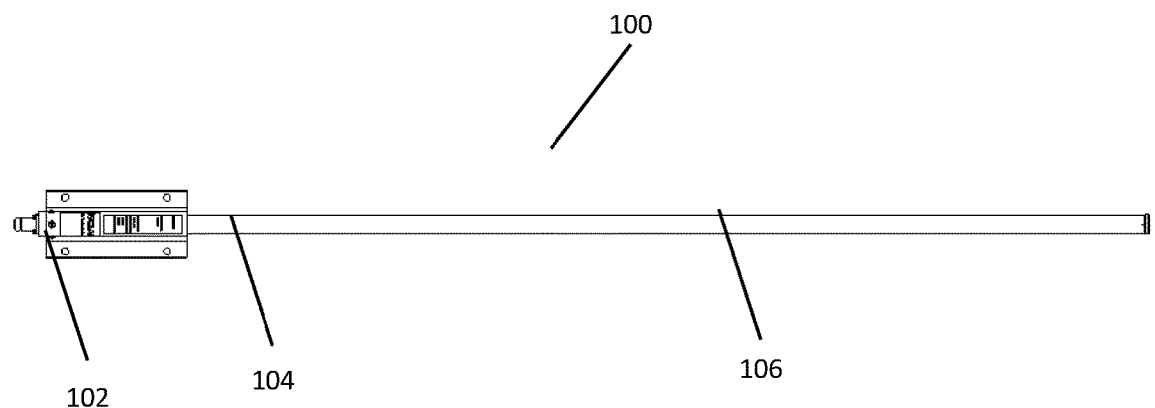
FIG. 1 illustrates a plural band collinear antenna enclosed within an envelope made by non-conducting materials, such as fiberglass, in accordance with an embodiment of the invention.

Referring to FIG. 1, the antenna 100, according to an embodiment of the invention, covers a plural band in the range of 100 MHz to 1000 MHz. In particular, the frequency of interest of the embodiment includes three sub-bands, namely VHF, UHF, and 700/800 MHz. The antenna 100 is comprised of a radio frequency (RF) connector 102, a base pipe 104, and a radome 106 enclosing radiation structures. The base pipe 104, preferably made of aluminum, mates the RF connector 102, and the radome 106 which is made of fiberglass as will be appreciated.

Figure 2:
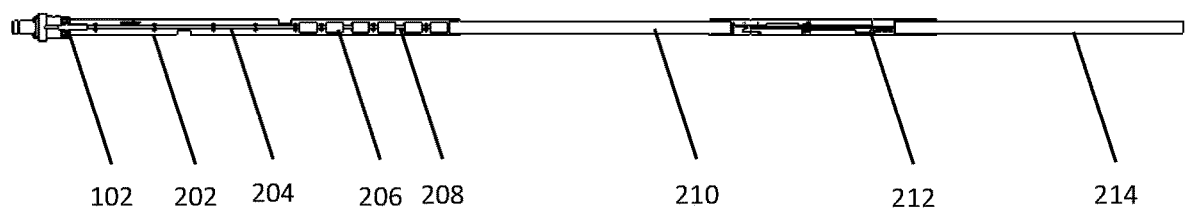
FIG. 2 presents the main parts to transmit\receive electromagnetic radiation.

Referring to FIG. 2, the radiation structures are separated from the RF connector 102 by the first dielectric 202. As will be appreciated, this reduces the influence from the base pipe 104 on the radiation structures and makes the antenna 100, as a whole, a ground-free one. The antenna 100 can transmit RF signals between the RF connector 100 and the radiation structures through an impedance-matched coaxial cable 204 which goes through the bottom conducting tube 210. A portion of the coaxial cable 204 is fastened to the first dielectric 202 by cable ties 208. Several ferrite toroids 206 are used to wrap friction of the coaxial cable 204 to limit the unwanted current going back to RF connector 102 and to improve the electrical stability of the antenna 100.

The radiation structures are classified as the primary radiation structures, including a bottom conducting tube 210 and a top conducting tube 214, and the secondary radiation structures, formed by conventional printed circuit board (PCB) techniques, are patterned on the first and second layers of the second dielectric 212. The fundamental electromagnetic radiation frequency of the primary radiation structures contributes to a portion of the VHF sub-band. The harmonic electromagnetic radiation frequencies of the primary radiation structures also contribute to portions of the UHF and 700/800 MHz sub-bands.

Figure 3:
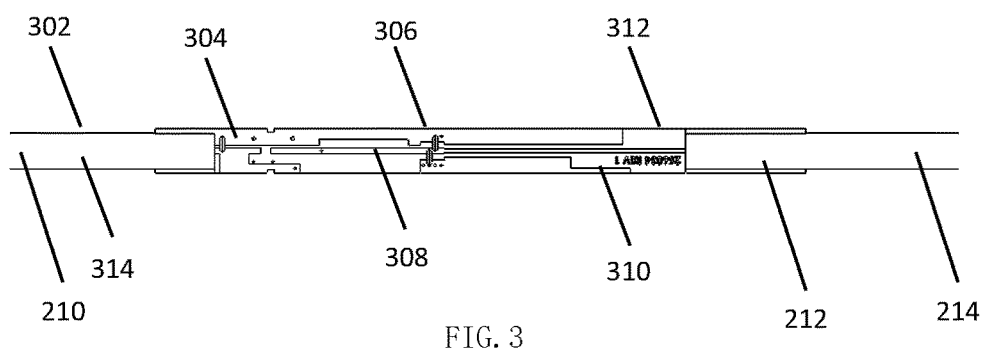
FIG. 3 is the pattern on the first layer on the second dielectric with a plural band matching circuit.

Referring to FIG. 3, the outer conductor (not shown) of the coaxial cable is soldered with bottom conducting tube 210, and its inner conductor is soldered with stub 314.

Figure 4:
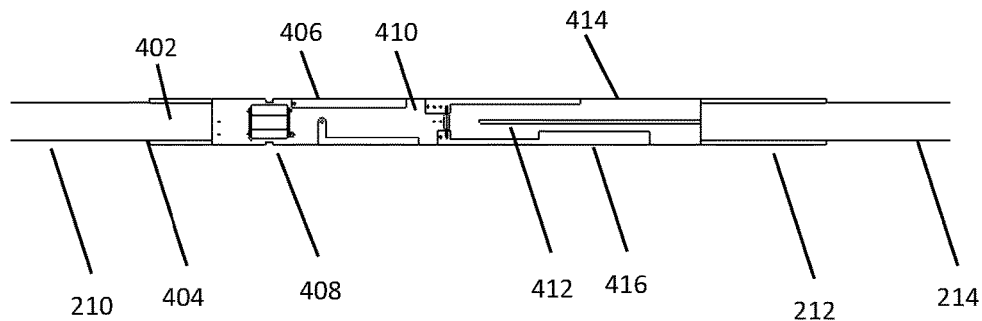
FIG. 4 is the pattern on the second layer on the second dielectric with a plural band matching circuit.

Referring to FIG. 3 and FIG. 4, the metal traces 412 and 416 are disposed on the second layers of the second dielectric 212 and mainly contribute to the electromagnetic radiation at the UHF sub-band, which are electromagnetically coupled to the top conducting tube 214. The metal traces 310, 312, and 414 are disposed on the first and the second layers of the second dielectric 212, respectively, and mainly contribute to the electromagnetic radiation at 700/800 MHz sub-band, which are electromagnetically coupled with the feeding trace 304.

An impedance-matching circuit is included in an embodiment of the present invention to further extend the bandwidth in a plural band simultaneously with a low VSWR, which is composed of stubs 316, 406, and 408, lumped components, and balun 402 disposed on the second dielectric 212. The stubs 316 and 406 are electrically connected by a metallic via. Stub 408 is electrically connected with feeding trace 304 by a metallic via. For lumped components, only capacitive lumped elements, depicted by the numerals 302, 306, 308, and 410, are used in this particular embodiment. However, extra or alternative lumped elements with other forms can be used in the impedance-matching circuit.

The balun 402 is disposed on the second dielectric with a dent (not shown) beneath balun 402. The dent and cable tie 402 limits the moving room of the balun 402.

Figure 5:
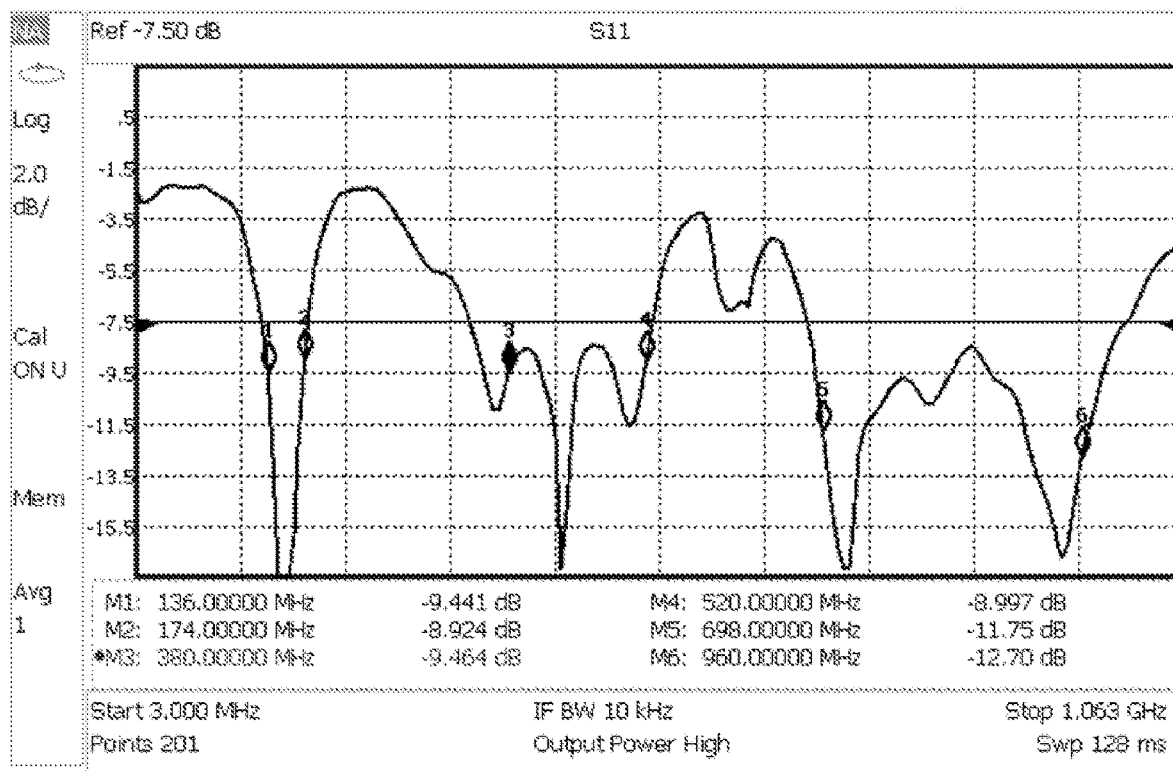
FIG. 5 is the measured reflection coefficient of an embodiment of the invention covering VHF, UHF and 700/800 MHz.

Referring to FIG. 5, the performance of the embodiment is measured. The measured VSWR demonstrates the embodiment of the invention is operable in a plural band with low VSWR. For this particular embodiment, its electromagnetic radiation covers 136-174 MHz, 380-520 MHz, and 698-960 MHz with a VSWR lower than 2.5 or a return loss less than 7.5 dB.

One embodiment of the invention has been illustrated with details. However, such embodiment is illustrated here by way of example only. The invention is not limited to these specific features, since some variations may come from the same techniques according to the appended claims.

What is claimed is:

1. An antenna having a connector, the antenna comprising:
    (a) a dipole having a first conducting tube and a second conducting tube disposed collinear to the first conducting tube, the first and second conducting tubes being attached to a dielectric substrate extending between the first and second conducting tubes, the dipole being operable to radiate electromagnetic energy in a first frequency bandwidth;
    (b) a secondary radiation structure disposed on the dielectric substrate, the secondary radiation structure being operable to radiate electromagnetic energy in a second frequency bandwidth higher than the first frequency bandwidth; and
    (c) an impedance-matching circuit disposed on the dielectric substrate in electrical communication with the connector, the impedance-matching circuit being operable to facilitate radiation in the first frequency bandwidth via fundamental operation of the dipole, the impedance-matching circuit being further operable to facilitate radiation in the second frequency bandwidth via fundamental operation of the secondary radiation structure and via harmonic operation of the dipole.

2. The antenna of claim 1 wherein the secondary radiation structure is operable to radiate electromagnetic energy in a third frequency bandwidth higher than the first and second frequency bandwidths.

3. The antenna of claim 2 wherein the impedance-matching circuit is operable to facilitate radiation in the third frequency bandwidth via fundamental operation of the secondary radiation structure and via higher-harmonic operation of the dipole.

4. The antenna of claim 1 wherein at least one of the impedance-matching circuit and the secondary radiation structure comprises a capacitor and a stub disposed on a first side of the dielectric substrate, the impedance-matching circuit comprising a balun disposed on a second side of the dielectric substrate opposite the first side.

5. The antenna of claim 4 wherein the antenna is ground-free.

6. The antenna of claim 1 comprising a connecting dielectric substrate that extends within the first conducting tube between the connector and the dielectric substrate.

7. The antenna of claim 6, wherein the connecting dielectric substrate is integrally coupled to the dielectric substrate.

8. The antenna of claim 1 comprising a transmission line extending within the first conducting tube between the connector and the impedance-matching circuit.

9. The antenna of claim 8 wherein the transmission line is a coaxial cable.

10. The antenna of claim 9 further comprising a ferrite toroid circumscribing the coaxial cable.

11. The antenna of claim 9 wherein the coaxial cable comprises an outer conductor and a center conductor extending within the outer conductor, the outer conductor being in electrical communication with the first conducting tube, the center conductor being in electrical communication with a feeding trace extending along the dielectric substrate, the feeding trace being electromagnetically coupled with the second conducting tube.

12. The antenna of claim 11 wherein the center conductor is in electrical communication with the feeding trace via a balun disposed on the dielectric substrate.

13. The antenna of claim 1 further comprising a base pipe extending between the connector and the first conducting tube.

14. The antenna of claim 13 wherein the dielectric substrate extends from the connector to the second conducting tube, the dielectric substrate extending within the base pipe and within the first conducting tube.

15. The antenna of claim 14 further comprising a radome enclosing the secondary radiation structure and enclosing the first and second conducting tubes, the radome being collinear to the base pipe.

16. The antenna of claim 1 wherein the secondary radiation structure is operable to radiate electromagnetic energy in a third frequency bandwidth higher than the first and second frequency bandwidths, the impedance-matching circuit comprising a balun, and the antenna comprising a transmission line extending within the first conducting tube between the connector and the balun.

17. The antenna of claim 2 wherein the first frequency bandwidth is the frequency range of 136 MHz to 174 MHz, the second frequency bandwidth is the frequency range of 380 MHz to 520 MHz, and the third frequency bandwidth is the frequency range of 698 MHz to 960 MHz.

18. The antenna of claim 17 wherein the antenna is operable to transmit and receive electromagnetic energy in the first, second, and third frequency bandwidths, and wherein the impedance-matching circuit is operable to facilitate transmission and reception of electromagnetic energy in the third frequency bandwidth via fundamental operation of the secondary radiation structure and via higher-harmonic operation of the dipole.

19. An antenna having a connector, the antenna comprising:
- (a) first means for radiating electromagnetic energy in a first frequency bandwidth via fundamental dipole operation;
- (b) second means for radiating electromagnetic energy in a second frequency bandwidth via secondary dielectric-mounted operation and harmonic dipole operation, the second frequency bandwidth being higher than the first frequency bandwidth; and
- (c) means for impedance matching a connectorized input to the first means and to the second means.

20. The antenna of claim 19 further comprising third means for radiating electromagnetic energy in a third frequency bandwidth via tertiary dielectric-mounted operation and via higher-harmonic dipole operation, the third frequency bandwidth being higher than the second frequency bandwidth.

\* \* \* \* \*